United States Patent
Essers

(10) Patent No.: US 6,707,041 B2
(45) Date of Patent: Mar. 16, 2004

(54) DETECTOR FOR A SCANNING ELECTRON MICROSCOPE WITH VARIABLE PRESSURE AND SCANNING ELECTRON MICROSCOPE WITH SUCH DETECTOR

(75) Inventor: Erik Essers, Karlsruhe (DE)

(73) Assignee: Leo Elektronermikroskopie GmbH, Oberkochen (DE)

( * ) Notice: Subject to any disclaimer, the term of this patent is extended or adjusted under 35 U.S.C. 154(b) by 69 days.

(21) Appl. No.: 10/161,131

(22) Filed: May 29, 2002

(65) Prior Publication Data

US 2003/0010913 A1 Jan. 16, 2003

Related U.S. Application Data

(63) Continuation-in-part of application No. PCT/EP00/11948, filed on Nov. 29, 2000.

(30) Foreign Application Priority Data

Nov. 29, 1999 (DE) ......................... 199 57 422

(51) Int. Cl.[7] ................. H01J 37/244; H01J 37/28
(52) U.S. Cl. ................. 250/310; 250/306; 250/397
(58) Field of Search .................... 250/310, 306, 250/397

(56) References Cited

U.S. PATENT DOCUMENTS 5,396,067 A * 3/1995 Suzuki et al. ............ 250/310

FOREIGN PATENT DOCUMENTS

| WO | WO 98/40906 | 9/1998 | ......... H01J/37/244 |
| WO | WO 99/27559 | 3/1999 | ......... H01J/37/244 |

OTHER PUBLICATIONS

Patent Abstracts of Japan 02273445 dated Jul. 11, 1990, in the name of Nikon Corp., Shinobu.

International Search Report for PCT/EP00/11948 dated Mar. 5, 2001.

* cited by examiner

Primary Examiner—Nikita Wells

(57) ABSTRACT

A detector for scanning electron microscopes with high pressure in the sample chamber has a first electrode for accelerating electrons emergent from a sample received on the sample holder, and at least one second electrode, the end of which directed toward the sample holder is at a smaller distance from the sample holder than the first electrode, and is at a potential between the potential of the first electrode and the potential of the beam guiding tube. The volume of the secondary electron cascade is increased by the second electrode. In an alternative embodiment for a gas scintillation detector, there is adjoined to a region of high secondary electron amplification, an elongate region in which the amplification factor for secondary electrons is approximately 1. The first region serves for the production of a relatively large electron current and the second, elongate, region for the production of a strong photon signal while maintaining the photon current.

45 Claims, 8 Drawing Sheets

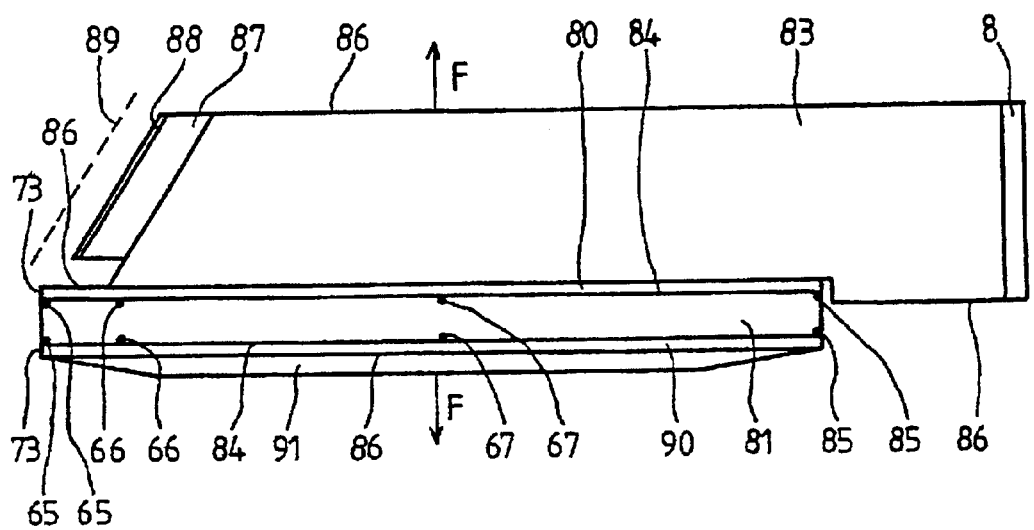
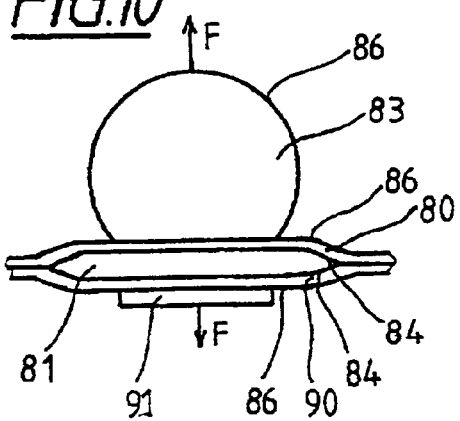

DETECTOR FOR A SCANNING ELECTRON MICROSCOPE WITH VARIABLE PRESSURE AND SCANNING ELECTRON MICROSCOPE WITH SUCH DETECTOR

CROSS-REFERENCES TO RELATED APPLICANTS

This application is a C-I-P of PCT/EP00/11948 filed Nov. 29, 2000.

Not applicable.

STATEMENT REGARDING FEDERALLY SPONSORED RESEARCH DEVELOPMENT

Not applicable.

BACKGROUND THE INVENTION

The invention relates to a detector for a scanning electron microscope, in particular for a scanning electron microscope with variable pressure, and a scanning electron microscope with such a detector. By "scanning electron microscope with variable pressure", or HPSEM, is to be understood a scanning electron microscope with which operation is possible with gas in the sample chamber at a pressure of at least 0.1 Pa. In HPSEMs, there is usually used as detector a collector electrode with following operational amplifier, or a gas scintillation detector. The latter consists of a light guide with a following photomultiplier. In both cases, a secondary electron cascade in the gas is required. Arrangements which use a secondary electron cascade are described in, for example, U.S. Pat. Nos. 4,785,182, 5,396,067, 5,677,531, WO 99/27559, JP 2236939, JP 2276846, and JP 2273445, and also in the article by G. Danilatos in the journal Advances in Electronics and Electron Physics, Vol. 78, pp. 1–102, 1990. The following problems arise in connection with the secondary electron cascade:

1. The amplification factor and the secondary electron cascade are limited by flash-overs.

2. In the present HPSEMs with collector electrode, the final pressure limiting aperture is at a similar potential to the collector electrode, i.e., the electrode at the end of the secondary electron cascade. The secondary electron cascade therefore has to take place for the most part on the same path section in the gas along which the primary electron scattering takes place (in the reverse direction). The pressure and the gas section therefore cannot be freely chosen, but their product must be large enough in order to obtain a sufficient amplification factor of the secondary electron cascade, even when the pressure or the gas section otherwise often do not at all actually have to be so large. Correspondingly, under these conditions, an undesirably strong primary electron scattering has to be accepted. This disadvantage also occurs with detection in the beam guiding tube.

3. In HPSEMs with a collector electrode and a following operational amplifier, no high scanning speeds are possible. At low scanning speeds, not even normal scanning speeds are possible, such as are required for alignment. The reason for this is that the time constants of the operational amplifier are too large for these scanning speeds at too high an amplification factor of the operational amplifier.

4. In both HPSEMs with gas scintillation detectors and also HPSEMs with collector electrode, the efficiency of the detection system is not fully adequate. A worsened signal/noise ratio and a greater damage to the specimen by the beam are the consequences, due to which the carrying out of many tasks is frustrated.

SUMMARY OF THE INVENTION

The present invention has as its object to provide an improved detector for HPSEMs with which at least a part of the above-mentioned problems is eliminated. The object of the invention is furthermore to provide a HPSEM with such an improved detector. These objects are attained by a scanning electron microscope that operates with gas in a sample chamber having a beam guiding tube for primary electrons, a sample chamber, a sample holder arranged in the sample chamber, a final pressure limiting aperture through which the primary electrons enter the sample chamber, a first electrode at a positive potential with respect to the sample holder and the final pressure limiting aperture for acceleration of secondary electrons emergent from a sample received by the sample holder, the first electrode being arranged outside the beam guiding tube, and at least one second electrode comprising an end facing toward the sample holder that is at a smaller distance from the sample holder than the first electrode and is at a potential that is between the potential of the first electrode and the potential of the sample, or is at the potential of the sample. The second electrode surrounds the first electrode and is substantially in the form of a funnel having a funnel tip toward the sample.

These objects are also attained by a scanning electron microscope that operates with gas in a sample chamber, having a sample chamber, a sample holder arranged in the sample chamber, the sample holder having a sample potential, a final pressure limiting aperture through which the primary electrons enter the sample chamber, and an electrode arranged outside the beam guiding tube. The electrode is electrically poorly conducting and comprises at least two contacts, a first one of the at least two contacts having a first potential and a second one of the at least two contacts having a second potential. An end of the electrode facing toward the sample holder is at an electrical potential that is between a higher one of the first and second potentials and the sample potential, or at the sample potential. The contact with the higher one of the first and second potentials is at a positive potential with respect to the sample holder and the final pressure limiting aperture.

These objects are also attained by a detector for secondary electrons in a scanning electron microscope with high pressure in a sample chamber with the use of a secondary electron cascade. At least one electrode with low electrical conductivity is provided, which extends along an elongate interspace or elongate cavity. In an inlet-side region within or in front of the cavity or interspace, the at least one electrode can have a potential applied such that a high amplification for secondary electrons results, and an elongate volume region with a reduced amplification factor for secondary electrons adjoins this inlet-side region.

These objects are also attained by a detector for secondary electrons in a scanning electron microscope with high pressure in a sample chamber with the use of a secondary electron cascade. A plurality of electrodes are provided that extend along an elongate interspace or elongate cavity. In an inlet-side region within or in front of the cavity or interspace, the electrodes can have a potential applied such that a high amplification for secondary electrons results, and an elongate volume region with a reduced amplification factor for secondary electrons adjoins this inlet-side region. The application of potential to the electrodes in the elongate volume region takes place such that an adjacent electrical field counteracts a tenuation of the secondary electron cascade due to impacts in the gas and due to drifting of the secondary electrons to the walls, so that a high but uncritical ionization density remains sustained.

A scanning electron microscope according to the invention has, like the known HPSEMs, a beam guiding tube for the primary electrons, with a final pressure limiting aperture on the sample side through which the primary electrons enter the sample chamber; a sample chamber; a sample holder in the sample chamber; and a first electrode which is at a positive potential relative to the sample holder and the final pressure limiting aperture of the beam guiding tube. The potential difference between the sample and the first electrode serves to accelerate secondary electrons which are released by the primary electrons from the sample received in the sample holder, the known secondary electron cascade being formed by the impact of these accelerated secondary electrons with the surrounding gas molecules and leading to an amplification of the secondary electron current.

In the meaning of the present application, the region between the electron source and the final pressure limiting aperture is termed the beam guiding tube.

In a first embodiment of the invention, at least one second electrode is provided, the end of which facing the sample holder is spaced closer apart from the sample holder than is the first electrode. This second electrode is at a potential that is between the potential of the first electrode and the potential of the sample, or at the potential of the sample.

In a second embodiment of the invention, a single electrode with low electrical conductivity is provided, along which a potential difference is established due to two different applied potentials, in the manner of a resistance chain. An electrode with varying potential along its surface results due to this potential difference.

The potential difference between the sample holder and the first electrode is affected by means of the second electrode, or by the changing potential along the electrode, so that an increased volume arises with high but uncritical ionization density.

A spatially varying ionization density is produced in the gas by the secondary electron cascade, and is dependent on the geometry and applied potentials of the electrodes that are present. When too high an ionization density is locally produced in the gas, flashovers occur. Besides electrons, the photons of gas scintillation are also principally produced in the region of high ionization density.

The functional principle on which the invention is based consists of producing an enlarged volume with high but uncritical ionization density in order to obtain a higher amplification factor for the secondary electrons, or a stronger photon signal. An ionization density is here termed "uncritical" when no flashovers occur yet.

The enlarged region with high but uncritical ionization density is according to the invention bounded by electrodes so that this region is delimited relative to the rest of the sample chamber. This results from the fact that these electrodes delimiting the region simultaneously serve for the production of the enlarged region with high but uncritical ionization density.

A portion of the region with high ionization density can then also be situated outside the delimited region, for example in the form of a secondary electron cascade occurring in the delimited region. Here however in all, at least half of the volume with higher ionization density is nevertheless to be situated in the region which is delimited by the electrodes from the rest of the sample chamber.

The region delimited by the electrodes is situated outside the region enclosed by the beam guiding tube and delimited from the sample chamber by the final pressure limiting aperture. This has two advantages over an arrangement in which the enlarged region with higher but uncritical ionization density above the final pressure limiting aperture, and thus in the beam guiding tube. In the first place, no measures have to be undertaken so that the secondary electrons get through the pressure limiting aperture, which is problematic especially at large working distances and with small aperture diameters of the final pressure limiting aperture. Secondly, however, high primary electron scattering above the final pressure limiting aperture, and thus in the beam guiding tube, must above all not be accepted, which is inevitably the case when a high ionization density is to be attained in this region with a secondary electron cascade. A gas section with high primary electron scattering above the final pressure limiting aperture cannot be shortened by means of a small working distance, in contrast to a gas section below the final pressure limiting aperture. In the invention, by the arrangement outside the beam guiding tube of the region delimited by the electrode, it is possible to work with more moderate and lower primary energy, with the known advantages associated therewith.

The invention's concept of an enlarged region with high but uncritical ionization density that is situated as a region delimited above the sample chamber by electrodes and outside the beam guiding tube, can be implemented in various ways:

In one embodiment, the volume with high but uncritical ionization density is enlarged perpendicularly to the direction of propagation of the secondary electron cascade. In an alternative embodiment, the volume with high but uncritical ionization density is enlarged in the direction of propagation of the secondary electron cascade. Mixed forms are furthermore also possible, in which the volume with high but uncritical ionization density is enlarged both perpendicularly of, and also in, the direction of propagation of the secondary electron cascade.

TECHNICAL FIELD

In the known HPSEMs with collector electrode, the ionization density reaches its maximum value close beneath the aperture of the final pressure limiting aperture. In the known HPSEMs with gas scintillation detectors, the ionization density reaches its maximum value close in front of the positive electrode at the end of the secondary electron cascade. With suitable potentials applied to additional electrodes, the result is attained according to the invention that the secondary electron cascade is distributed over a greater volume, so that in all higher amplification factors are attained with uncritical ionization densities at the same time. A substantially higher amplification factor of the secondary electron cascade and of the photons produced by it can be attained with the detectors for HPSEMs according to the invention and the arrangements according to the invention, since the secondary electron cascade is shaped by the second electrode so that the region with the highest ionization density takes up a much larger volume. A much greater amplification factor of the secondary electron cascade and of the photons produced by it can thereby be attained with the same maximum ionization density.

The second disadvantage mentioned hereinabove is avoided by the detector according to the invention, since a secondary electron cascade with high amplification factor is possible between the region close below the final pressure limiting aperture and the electrode at the end of the secondary electron cascade, and therefore a higher amplification factor of the secondary electron cascade does not need to be attained in the region close below the final pressure limiting aperture.

The third problem mentioned hereinabove is solved with the detectors according to the invention by the much greater amplification factor of the secondary electron cascade attainable due to the enlarged volume with large ionization density. Only a slight further amplification by the following operational amplifier is necessary because of this.

In HPSEMs with gas scintillation detectors, the detection efficiency can be improved by a higher amplification factor of the secondary electron cascade. To this extent, the invention is also suitable for HPSEMs with gas scintillation detectors.

In a further advantageous embodiment of the invention, the second electrode or the poorly conducting electrode runs, inclined in the direction toward the sample holder, from the first electrode and forms, at its end toward the sample holder, an aperture for the passage of the field formed by the first electrode or for the field of auxiliary electrodes, which transmits the secondary electrons toward the first electrode.

Further additional auxiliary electrodes are preferably provided for improving the transmission of the secondary electrons through the aperture defined by the end of the second electrode.

Furthermore, the first and second electrodes are made rotationally symmetrical to the optical axis of the scanning electron microscope, i.e., to the beam guiding tube. For this purpose, the first electrode can annularly surround the beam guiding tube, and the second electrode can be formed as a funnel-shaped electrode that surrounds the first electrode and runs conically toward the sample holder. Passage of the field that guides the secondary electrons to the first electrode takes place through the aperture, directed toward the sample, of the second electrode. Negative affects on the primary electrode beam are reduced by the rotational symmetry of the electrode arrangement.

One of the further auxiliary electrodes can be formed as a cylindrical electrode surrounding the beam guiding tube in tubular form.

The first and second electrodes and/or the further auxiliary electrodes can also be constituted as a single electrode with low electrical conductivity, e.g., as an insulator with a poorly electrically conducting coating. Constitution as a solid electrode of a material with low electrical conductivity is also possible, instead of a thin coating on an insulator. Due to the low conductivity of the electrode, a locally different potential is then established along the electrode in the manner of a voltage divider circuit. The end of this poorly conducting electrode facing toward the sample, or the contact at this end, corresponds to the second electrode in the embodiment with separate first and second electrodes. The place, i.e., contact, of the poorly conducting electrode to the highest potential, corresponds to the first electrode in the embodiment with separate first and second electrodes. Therefore, by analogy with the embodiment with separate first and second electrodes, the end of the poorly conducting electrode facing toward the sample is at a lower potential than the place of the poorly conducting electrode with the highest potential.

In a further embodiment of the invention, the poorly conducting electrode is installed in a light guide in the interior of a cavity that is open to one side. The place of contact of this poorly conducting electrode with the highest potential again corresponds in its function to the first electrode. It is situated in the cavity of the light guide at a large distance from the inlet opening on the sample side. The contact of the poorly conducting coating in the neighborhood of the sample-side opening of the cavity corresponds in its function to the second electrode in the embodiment with separate first and second electrodes. The contact of the poorly conducting coating in the neighborhood of the inlet opening of the cavity on the sample side can take place by an electrode which is installed on the outer surface of the light guide and which also serves there as a metallization of the light guide.

The cavity can be constituted in a conical or pyramidal form in order to improve the light conduction in the light guide to a light detector.

However, other shapes of the cavity are possible, for example, a cylindrical bore.

Furthermore, it is possible to constitute the poorly conducting electrode in a region in the neighborhood of the inlet opening with a smaller layer thickness than in a region more remote from the inlet opening. Due to the low conductivity resulting therefrom in the neighborhood of the inlet opening, a higher field strength results in this region than in the region more remote from the inlet opening.

The first electrode, or the contact corresponding to it, extends in a cavity of the light guide, preferably on at least two opposed sides of the cavity, over extended sections in the cavity, in order to distribute the secondary electron cascade over as large a volume as possible.

In an embodiment of the invention in which the volume with high but uncritical ionization density is enlarged in the direction of the direction of propagation of the secondary electron cascade, several electrodes, or a single, only poorly electrically conducting electrode, extend along an elongate cavity or interspace in a light guide or bordering on a light guide.

An "elongate cavity or interspace" is to be understood as a cavity or interspace whose length is greater than twice the greatest diameter of a circle that can be inscribed in the cross section of the cavity or interspace. In an inlet-side region of the cavity, the electrodes have a potential applied to them such that a high amplification factor results for secondary electrons. Alternatively, additional electrodes can also be provided in front of the inlet opening and can have an applied potential such that a high amplification factor results for secondary electrons. A second region of the cavity or interspace adjoins this inlet-side region, and in it the electrodes have different, weak potentials applied such that in this second region a markedly reduced amplification factor for secondary electrons results, preferably between 0.2 times and 5 times, and ideally a factor of 1.

This second region is an elongate region. No, or no great, amplification of the secondary electron current admittedly takes place in it, but the aim is that a high but uncritical ionization density further remains maintained in it. The secondary electron cascade is constantly attenuated there by impacts in the gas and by the diffusion of the secondary electrons to the walls of the interspace, but is simultaneously amplified again by the adjacent field. A strong gas scintillation occurs in this volume region due to the high ionization density, and can be detected by a photodetector arranged at the end of the light guide. This detector arrangement also makes possible a substantial improvement of the detection sensitivity, by means of an enlarged volume with uncritical ionization density.

A further embodiment consists of a combination with an Everhardt-Thornley detector, in that the end face of the light guide that is present in any case is constructed as a scintillator and is provided with a thin, conductive layer as a contact to which a high voltage can be applied. By means of a further grid electrode mounted in front and largely screening this high voltage from the primary electron beam, the detector arrangement can also be used for electron detection in vacuum operation of the electron microscope.

While in the present usual HPSEMs with collector electrode, a high electric field density is frequently present in the region of the aperture of the final pressure limiting aperture, leading to a marked curvature of the electrical field within the pressure limiting aperture, negatively affecting the primary electrons, and leading to a deterioration of resolution, in the detectors according to the invention, only a weaker electric field strength is required in the region of the aperture of the lower pressure limiting aperture, so that this disadvantageous effect is decreased.

A further embodiment consists in that the axis and/or the midplane of the cavity or interspace is not straight or not planar, respectively, but is curved. First, this has the advantage that many particles that can favor a breakdown, e.g., X-Ray quanta, cannot propagate far in the cavity. Second, this has the advantage that highly energetic electrons cannot well follow the curved course of the field, and therefore, even without collisions in the gas, the highly energetic electrons more easily reach the wall.

An embodiment of such a cavity with a curved axis, preferred because it is easily produced, is (for example) a helical cavity in which the coil can be worked from a cylindrical inner portion and, together with an outer hollow cylinder as the outer portion, forms the helical cavity.

BRIEF DESCRIPTION OF THE DRAWINGS

Further advantageous embodiments and properties will become apparent from the following description of the embodiments shown in the Figures.

FIG. 9 is a schematic sectional diagram of a further embodiment of a gas scintillation detector, in which the distance of opposed cavity walls is variable, and FIG. 10 is a diagram of the detector of FIG. 9 in a sectional plane perpendicular to FIG. 9.

DETAILED DESCRIPTION OF THE INVENTION

Figure 1:
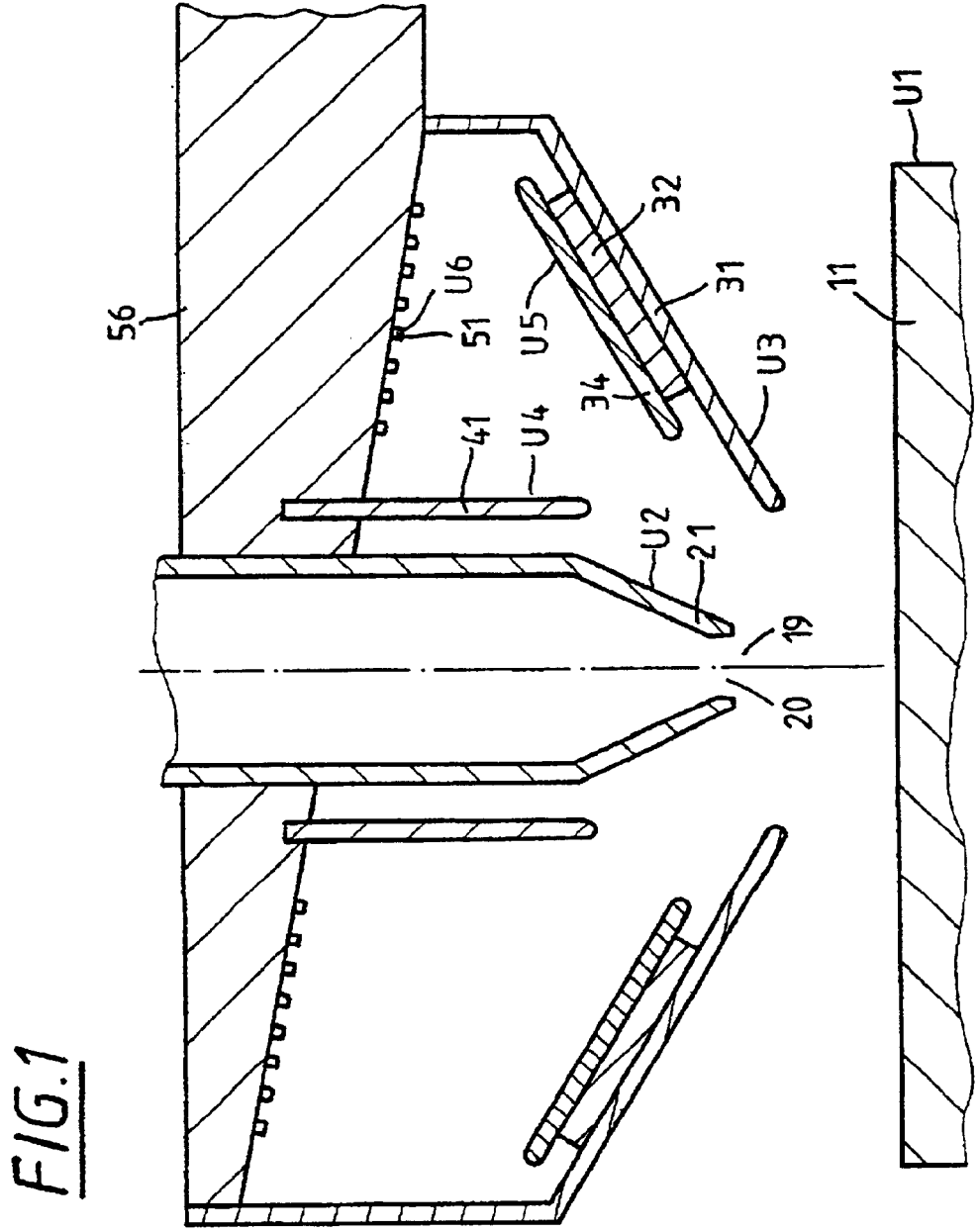
FIG. 1 is a schematic diagram of a gas scintillator detector according to the invention in a first embodiment.

FIGS. 1–10 show schematic diagrams of detectors according to the invention for HPSEMs. The microscope column, the sample chamber, pump devices, control devices, etc., are not shown there. Likewise, the voltage source for production of the potentials U1–U9 and the operational amplifiers that are connected to the collector electrodes, or the photomultipliers that are connected to the light guide, are not shown.

In FIGS. 1–6, the primary electrons pass through the aperture 20 of the final pressure limiting aperture 21 of the beam guiding tube to the sample 11 received by a sample holder (not shown), where they produce secondary electrons. The emitted secondary electrons, and the secondary electrons produced from them in the gas, are laterally deflected by the electric field in the region 19 below the final pressure limiting aperture, and are accelerated toward the first electrode (50, 51, 52, 67) that is arranged at the end of the secondary electron cascade and to which the electric field leads. This leads to the amplification by the production of secondary electrons in the gas taking place for the most part along the electric field between the region 19 and the electrode (50, 51, 52, 67) arranged at the end of the secondary electron cascade. The positive ions then produced by the secondary electron cascade follow the electric field in the reverse direction and are transported toward the region 19.

In FIG. 1, the preferred potential difference between the sample 11 and the final pressure limiting aperture 21 is for example up to 800 V, according to the working distance, sample, and gas composition; with the use of water vapor, it is preferably between 250 and 450 V. A secondary electron cascade is hereby produced between the sample and the final pressure limiting aperture. The second electrode 31, which surrounds the first electrode 51 substantially in the form of a funnel with the funnel point toward the sample 11, is at a potential that is preferably 0–150 V positive with respect to the pressure limiting aperture 21. A further auxiliary electrode 34, which extends parallel to the second electrode, is received on the inner side of the funnel on the second electrode 31 via an insulator 32. A further auxiliary electrode 41 extends parallel to the beam guiding tube. The potentials of the further electrodes 41 and 34 are preferably positive by up to 250 V with respect to the potential of the second electrode 31, but are negative with respect to the first electrode 51. The field produced by the first electrode thereby penetrates into the region 19 below the pressure limiting aperture, and guides the secondary electrons through the opening formed by the second electrode 31 and the pressure limiting aperture 21. The further electrode 34 is attached to the second electrode 31 via an insulating layer 32. The further electrode 34 can likewise either be attached to the beam guiding tube via an insulator, or else (as shown in FIG. 1) attached to the pressure limiting aperture 21. The first electrode consists of several conductor paths or wires that are fastened to the surface of the light guide 56, and which have gaps formed between them through which the photons can enter the light guide. According to the detector geometry and gas composition, the potential of the first electrode 51 is above the potential of the final pressure limiting aperture 21 by, for example, 100–1,000 V; for water vapor as the gas, and the geometry shown in FIG. 1, preferably by 200–500 V. Overall, a higher potential difference is thus attained between the sample and the first electrode 51, at which the secondary electron cascade ends, than is possible in known HPSEM detectors at the same gas pressure. The higher potential difference between the sample 11 and the first electrode 51 leads to a substantially higher amplification factor of the secondary electron cascade and to the advantages connected thereto, as were enumerated hereinabove.

Figure 2:
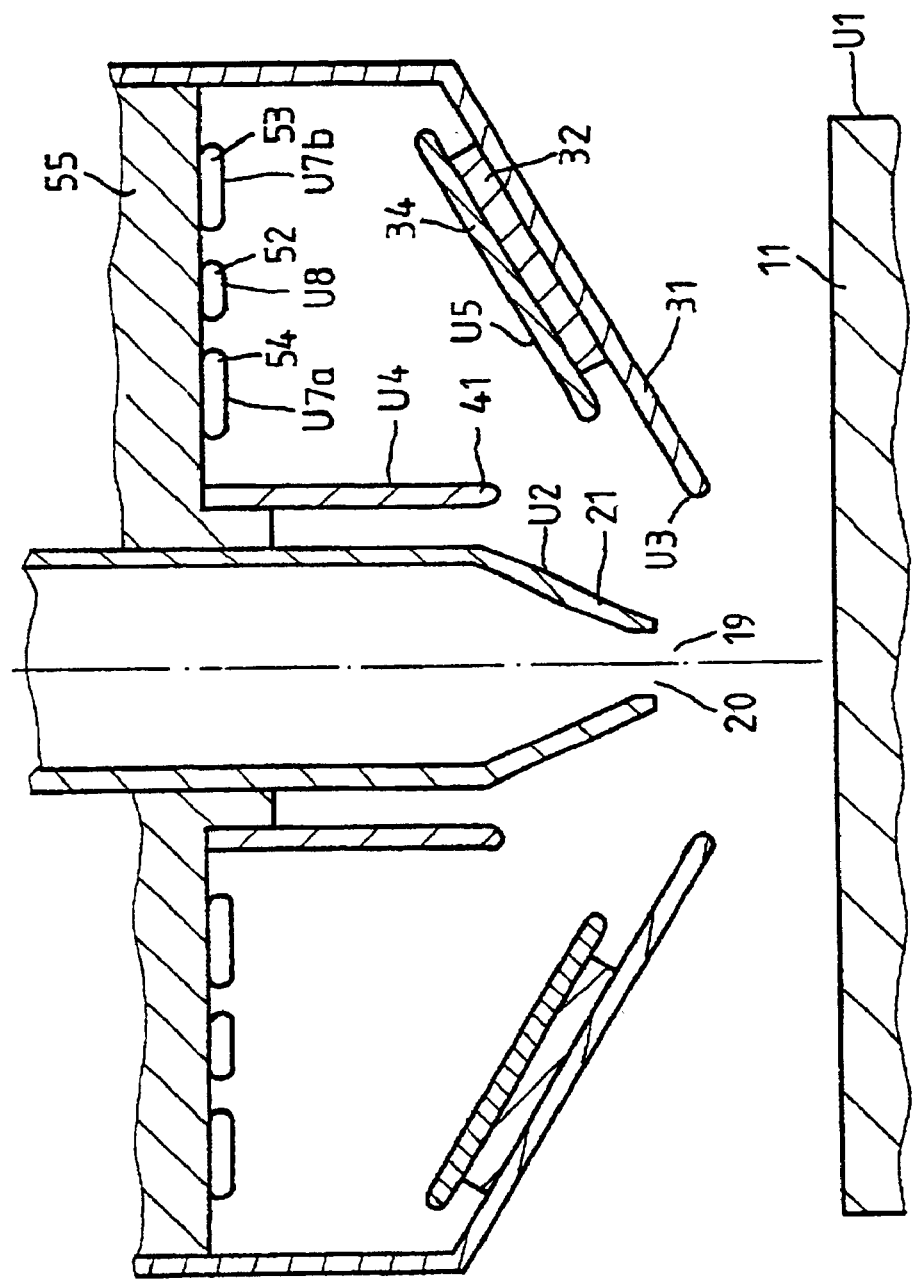
FIG. 2 is a schematic diagram of a HPSEM detector with a collector electrode, according to the invention.

FIG. 2 shows a schematic diagram of a HPSEM detector with collector electrode, according to the invention. The preferred potential differences between the sample 11, the final pressure limiting aperture 21, and the electrodes 31, 41 and 34, are the same as in FIG. 1. In FIG. 2, the secondary electron cascade ends at the collector electrode 52, which is positive by, for example, 150–1,000 V with respect to the pressure limiting aperture 21, according to the detector geometry and gas composition, and which represents the first electrode. For water vapor and the geometry shown in FIG. 2, the potential difference is preferably between 250 and 500 V. The further auxiliary electrodes 54 and 53 can be omitted if a simple construction is desired. The advantage of the use of the auxiliary electrodes 53 and 54 consists of improved passage of the field of the collector electrode 52 as far as the gap-shaped opening between the other auxiliary electrodes 34 and 41. The potential of the auxiliary electrodes 53 and 54 is then preferably between 0 and 100 V negative with respect to the potential of the collector electrode 52 for the geometry schematically shown in FIG. 2. In order to further enlarge the gas section through which the secondary electron cascade passes, the auxiliary electrode 34 can also be divided into several portions, which can then be placed at different potentials and can contribute to deflecting the secondary electrons in regions that are still further remote from the optical axis and in which the collector electrode is then arranged. This has the advantage that, at the same amplification factor of the secondary electron cascade, a still smaller ionization density is attained at the end of the secondary electron cascade before the collector electrode. Correspondingly, a still higher amplification factor of the secondary electron cascade is possible without obtaining flashovers. The collector electrode 52, the auxiliary electrodes 53 and 54, the electrode 41 surrounding the beam guiding tube in the form of a tube, and the second electrode 31 in a funnel shape surrounding the collector electrode 52, are fastened to the insulator 55.

Figure 3:
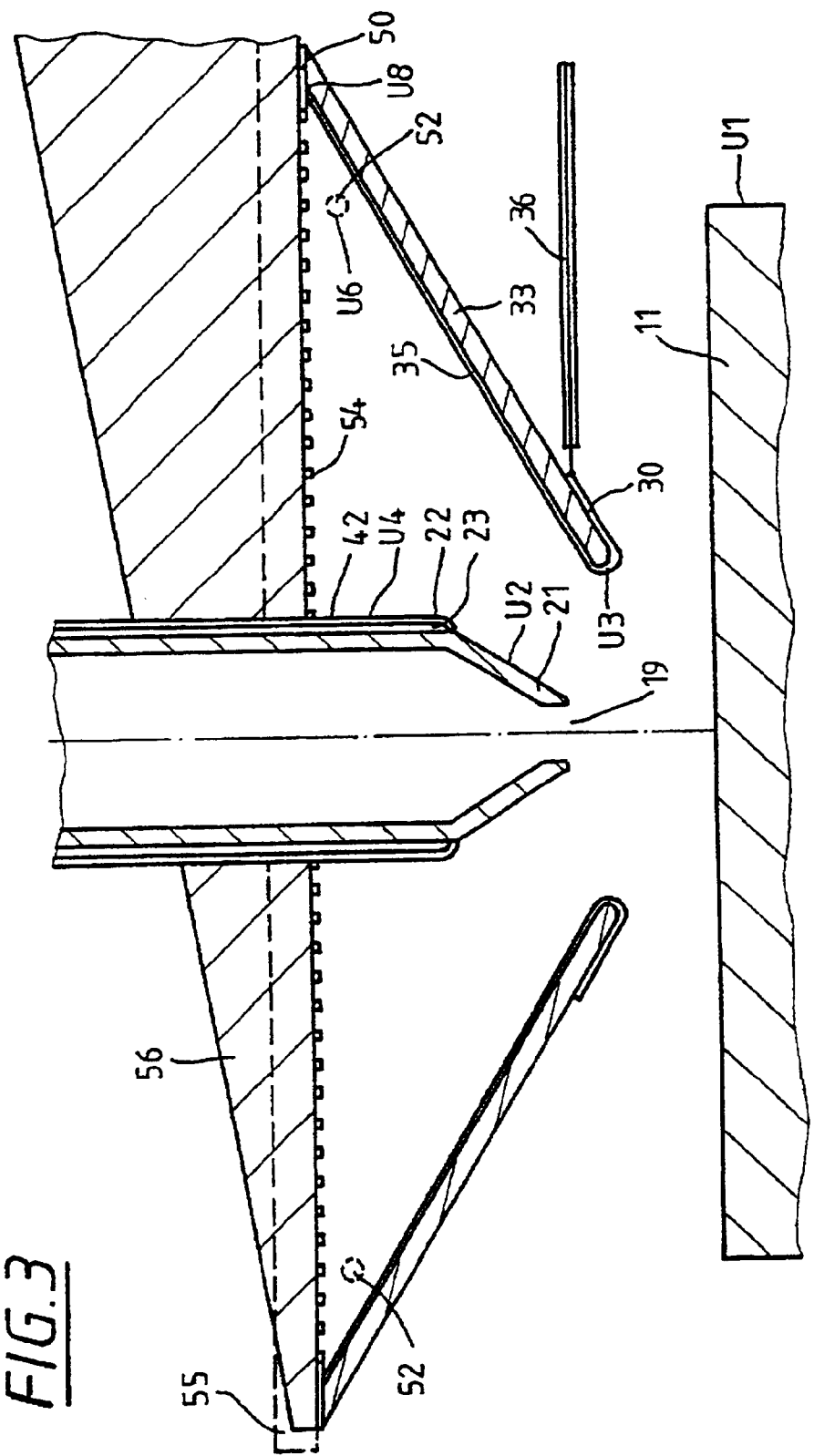
FIG. 3 is a schematic diagram of a detector according to the invention, in which electrodes are used, along the surface of which a continuous voltage drop takes place.

FIG. 3 shows a schematic diagram of a further detector according to the invention for a HPSEM. With the use of a light guide 56 instead of the insulator 55, it represents a gas scintillation detector. With the use of the collector electrode 52 (dashed) with a following operational amplifier, it is at the same time also a detector with collector electrode. If it is to be used exclusively as a detector with collector electrode, the light guide 56 can be replaced by the flat insulator 55, shown dashed, and the constructional height can be thereby reduced. Instead of the second electrode 31 in FIGS. 1 and 2, there is the insulator 33 in FIG. 3 whose underside has a layer 30 with good conductivity, for example a metal layer that takes over the function of the electrode 31. The preferred potential difference between the sample 11 and the pressure limiting aperture 21 is the same as in FIGS. 1 and 2. The preferred potential difference between the pressure limiting aperture 21 and the metal layer 30 in FIG. 3 is the same as the potential difference between the pressure limiting aperture 21 and the first electrode 31 in FIGS. 1 and 2. A thin layer 35 is shown on the upper side of the insulator 33. It has medium or low conductivity and is contacted at the boundary with the metal layer 30 with the potential U3 of the metal layer 30. At its outer edge, the layer 35 is contacted by the metal layer 50, the potential of which has the same preferred magnitude as the potential of the collector electrode 52 in FIG. 2. A voltage drop hereby arises along the thin layer 35. A similar voltage drop also arises at the opposing wall of the cavity along the light guide 56 or along the insulator 55. This has the result that the secondary electron cascade is guided into a region which is far removed from the optical axis, and that the secondary electrode 52 finally ends at the electrode 50 (or respectively ends at the collector electrode 52, when this is present). The advantage of this, when the secondary electron cascade is guided into a region far removed from the optical axis, was already mentioned in connection with FIG. 2. The advantage of using electrodes (35, 54) along which a continuous voltage drop is present is that it is particularly successful in guiding the secondary electron cascade into regions that are far removed from the optical axis. Apart from this, the constructional expense is reduced, since several electrodes that are at different potentials can be replaced by such an electrode. The contacting of the metal layer 30 with the potential U3 takes place by means of an insulated wire 36, which preferably runs approximately on the equipotential surface of U3 that would be present without the wire. The function of the electrode 41 of FIGS. 1 and 2 is taken over in FIG. 3 by the layer 42, of good conductivity that surrounds the beam guiding tube via an insulator 23, and that is, for example, a metal layer. Its potential is preferably between 5 and 250 V above the potential of the pressure limiting aperture 21, from which it is electrically separated by the insulating layer 23. A thin layer 22, of low conductivity, can be applied between the metal layer 42 and the electrode 21, and the voltage drop between the potentials U2 and U4 takes place along it. In order to simplify the construction, the metal layer 42, insulator 23 and metal layer 22 can even be omitted; of course, the field penetration attained for the electrical field that deflects the secondary electron cascade away from the optical axis is then not quite as good. A layer 54 with medium or low conductivity is applied to the light-transmitting underside of the light guide 56 in thin structures, for example, in net-like paths, where the width of the paths is less than 1 mm, and gaps through which the photons can enter the light guide are present between the conductive paths. This for example net-like layer is contacted by the metal layer 42 with the potential U4 and by the metal layer 50 with the potential U8, so that a voltage drop is present along this layer, similar to that in the layer 35 forming the second electrode. A particularly advantageous embodiment consists in that the layer 54 is transparent for the photons produced in the gas scintillation. Also, in this case, no gaps are required within the layer. If the insulator 55 is used instead of the light guide 56, the layer 54 along which the voltage drop takes place is likewise made without gaps, in order to attain as low as possible a production cost. In this case, the layer also does not have to be transparent.

Figure 4:
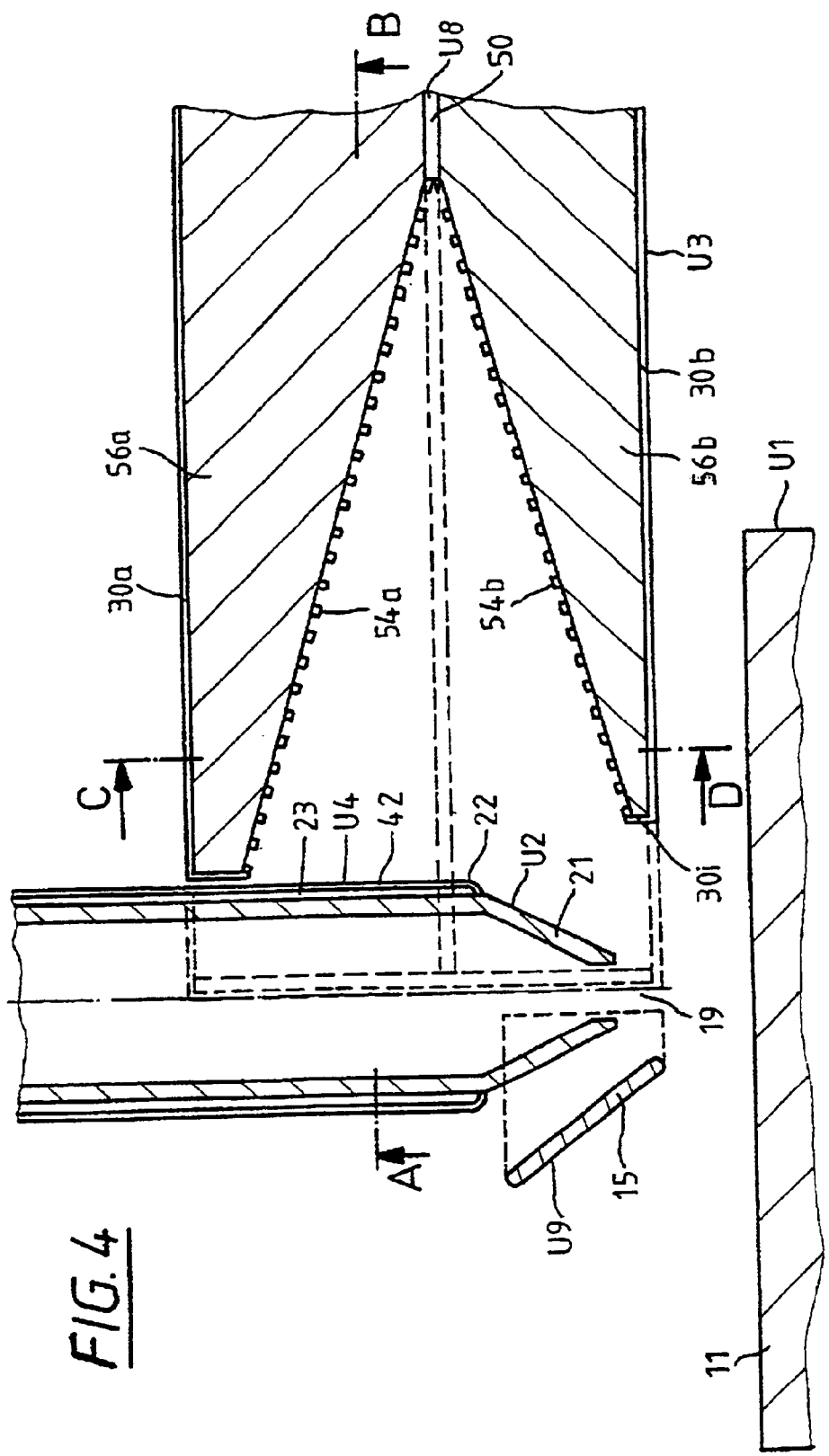
FIG. 4 is a schematic diagram of a detector according to the invention, in which electrodes are used in which light guides border on the secondary electron cascade from several sides.
Figure 5:
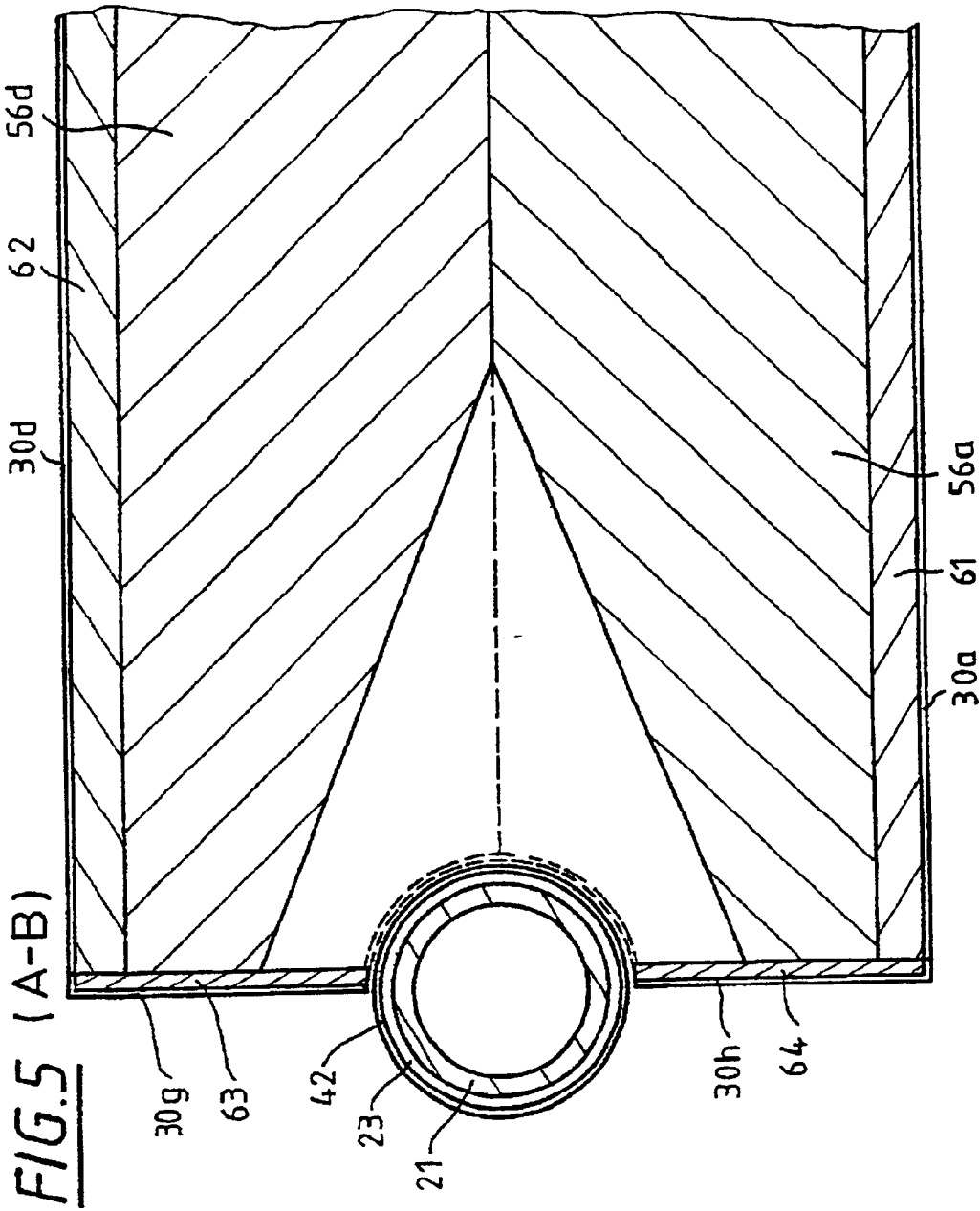
FIG. 5 is a schematic diagram of the detector of FIG. 4 in a sectional plane perpendicular to FIG. 4.
Figure 6:
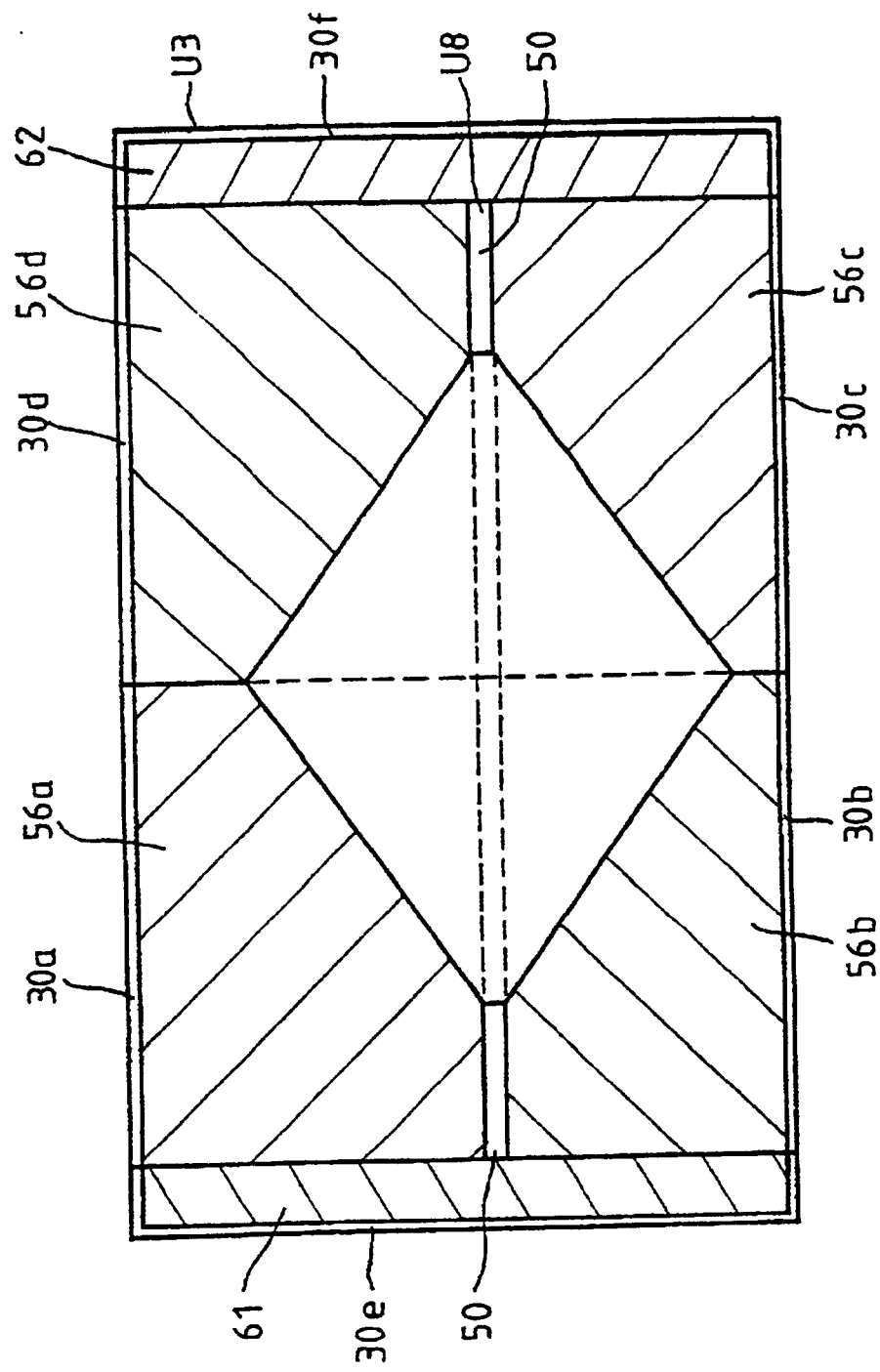
FIG. 6 is a schematic diagram of the detector of FIG. 4 in a sectional plane perpendicular to FIGS. 4 and 5.

FIGS. 4, 5 and 6 show, in different sectional planes, schematic diagrams of a further gas scintillation detector. The course of the sectional planes in FIGS. 5 and 6 is drawn in in FIG. 4. The portions of the light guide, insulating layer 64, and electrodes 15, 30 and 50 that are behind the plane of the drawing are shown dashed in FIG. 4. The light guide 56 is divided into four portions 56a, 56b, 56c and 56d. These form a pyramidal cavity, shown in FIG. 6 from the base of the pyramid. The walls of this cavity are formed by light-transmitting surfaces of the light guide, onto which there are applied, as in FIG. 3, layers (54a, 54b, 54c, 54d) with medium or low conductivity along which a voltage drop takes place. As in FIG. 3, these layers are here also structured so that gaps are present through which the photons can enter the light guide, or are transparent, so that the photons can pass through the layers themselves. As can be seen in FIGS. 5 and 6, additional insulators (61, 62, 63 and 64) are applied on the outside around the light guide. The light guide and the insulators are enclosed by a multi-part electrode 30 (consisting of 30a, 30b, 30c, 30d, 30e, 30f, 30g, 30h, 30i), which is at the potential U3. The layers 54a through 54d applied to the inner surface of the light guide are also contacted by this electrode. On the other hand, the layers 54a through 54d applied to the inner surface of the light guide are contacted by the electrode 50, which is at the potential U8 and is arranged on the whole bounding surface between the light guides, respectively, 56a and 56b or 56c and 56d. This electrode corresponds in its function to the electrode 50 in FIG. 3. The secondary electron cascade ends at it. As can be seen in FIG. 5, the light guides, seen from the optical axis, extend only to one side instead of to two sides, as is the case in the embodiments in FIGS. 1 and 3.

In contrast to the structures shown in FIGS. 1–3, in the construction of FIGS. 4–6 the electrodes are not rotationally symmetrical in the region between the sample 11 and the final pressure limiting aperture 21. The light guides 56b and 56c have a semicircular sector around the optical axis. An opening is thereby formed between them and the final pressure limiting aperture 21, and portions of the secondary electron cascade can enter the pyramidal cavity through the said opening. This is furthered in that the electrode 30 (also 30i) surrounding the light guides are at a higher potential, between 0 and 500 V preferably between 0 and 200 V, according to the magnification, primary energy, and working distance, with respect to the pressure limiting aperture 21. This unilaterally effective electrical field would have a negative effect on the attainable resolution. If a higher resolution is to be attained, a compensation electrode 15 situated opposite to the light guide with respect to the optical axis of the scanning electron microscope can therefore be given a potential U9 chosen so that in the region of the optical axis the electrical field in the direction of the compensation electrode 15 and the electrical field in the direction toward the light guide 56 are approximately compensated. The compensation electrode 15 has here the shape of a hollow frustroconical segment, the contour of which is shown dashed in FIG. 4. The sample in the construction shown in FIGS. 5–6 can thereby be very well tilted in the direction of the electrode 15. A change of the potential U9 can then also be effective against the worsening of resolution that would otherwise arise with a tilted sample due to the applied voltage between the sample 11 and the final pressure limiting aperture. The final pressure limiting aperture is at a potential that is selected according to the gas composition, working distance, and sample, and for water vapor is preferably between 0 and 500 V above the sample potential. The electrode 30, consisting of several partial electrodes, is at a potential with respect to the final pressure limiting aperture 21 of between 0 and 500 V , preferably between 0 and 200 volts positive for the detector geometry shown, but can be still greater for other detector geometries. As in FIG. 3, in FIGS. 4–6 an additional electrode 42 is provided which surrounds the beam guiding tube, consists of a metal layer, and is electrically insulated from the pressure limiting aperture 21 by an insulator layer 23. Its potential U4 is likewise preferably positive by 0–200 V with respect to the pressure limiting aperture 21 for the detector geometry shown. A constructional simplification is obtained in that the potential U4 of the electrode 42 surrounding the beam guiding tube is placed at the same potential as that of the electrode 30 surrounding the light guide. As in FIG. 3, a thin layer 22 with low or medium conductivity and a continuous voltage drop between the electrode 21 and the electrode 42 surrounding the beam guiding tube can also be provided in the construction in FIG. 4, in order to still further improve the course of the field and to cover the insulator 23. With a lower potential difference between the final pressure limiting aperture 21 and the electrode 30 surrounding the light guide, a constructional simplification is attained by omitting the electrode 42 surrounding the beam guiding tube, the insulator layer 23, and the thin layer 22.

In all, the manner of functioning of the construction shown in FIGS. 4–6 is similar to that of the construction shown in FIG. 3. A secondary electron cascade is produced between the sample 11 and the final pressure limiting aperture 21. Since later a further amplification of the secondary electron current takes place in the pyramidal cavity, a weak secondary electron cascade is sufficient here, in contrast to the detectors for HPSEMs known at present. According to the setting of the potentials U9, U3, U2 and U1, either the larger portion of the secondary electron cascade can be deflected to the right and upward into the pyramidal cavity, in which case, though, according to the primary energy and potential differences, the full spatial resolution of the microscope cannot be attained; or in FIG. 4 the right-hand half of the secondary electron cascade can be deflected into the pyramidal cavity, and the full resolution of the microscope can be attained. In the pyramidal cavity, the secondary electron cascade extends on all sides toward the first electrode 50, which is at the potential U8. The potential U8 is preferably, for example, according to the gas composition and detector geometry, between 100 V and over 1,000 V (for the schematically shown geometry and water vapor as the gas, preferably between 100 V and 600 V) above the potential U2 of the final pressure limiting aperture. The production of the secondary electron cascade in the pyramidal cavity that is enclosed by light guides has the advantage that a very large proportion of the photons produced by gas scintillation reach the light guide. This can alternatively also be attained with smaller constructional space and smaller cross sectional surface of the light guide in that the light guide surfaces are replaced by insulating reflecting surfaces, on which the poorly conductive layer is applied. An insulating, reflecting surface can also consist of a thin light guide that is metallized from behind. The pyramidal shape of the cavity has the advantage that structures of the layer with low or medium conductivity can be applied particularly easily to the light guide surface, since the bounding surfaces of the cavity are planar. It goes without saying that other shapes are however possible for the cavity, having no planar bounding surfaces, and are partially even more favorable as regards the electric field.

In FIGS. 1–4, the opening formed by the second electrode 31 or 30 or 30i, respectively, through which the secondary electrons arrive, is relatively large. However, it can also be substantially smaller (for example, of a size similar to the opening of the pressure limiting aperture), or can be replaced by several smaller openings that are arranged laterally of the pressure limiting aperture. The advantage of this consists in that it is possible to use for the secondary electron cascade another gas with a substantially higher amplification factor than that present in the sample chamber. In order to keep the exchange with the gas in the sample chamber as small as possible, it is advantageous to have the same pressure in the sample chamber and in the cavity in which the secondary electron cascade takes place. The cavity in which the secondary electron cascade takes place can then be flushed with the gas desired for the secondary electron cascade, in order to keep the contamination by the gas from the sample chamber as small as possible. A still smaller contamination by the gas from the sample chamber is obtained when the gas pressure in the cavity is kept higher than that in the sample chamber. With such a detector according to the invention, which works with a secondary electron cascade, operation nearly without gas in the sample chamber is also possible, such that the sample chamber is constantly evacuated and the gas present in the sample chamber consists only of the gas which flows out through the openings from the cavity in which the secondary electron cascade takes place.

Figure 7:
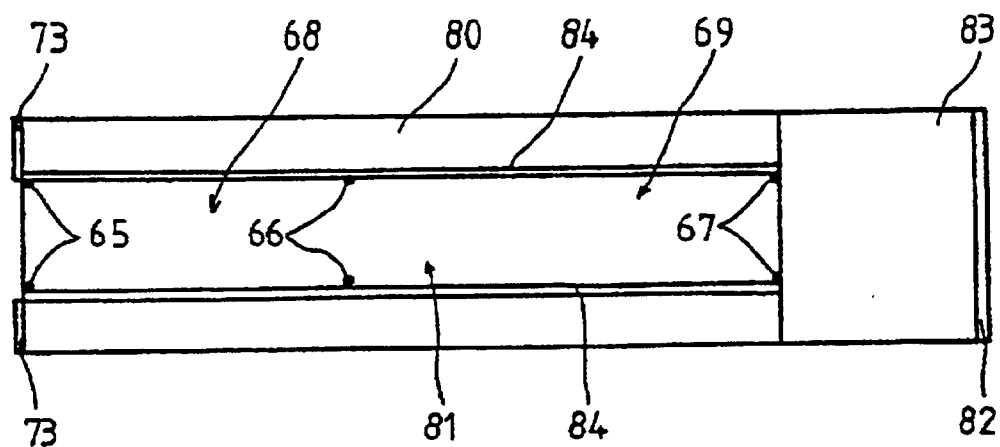
FIG. 7 is a section through a further embodiment for a gas scintillation detector.

The gas scintillation detector in FIG. 7 consists of a cylindrical tube 80 of a material that conducts light, with a photodetector 82 at the end of the light guide 83 and adjoining the cylindrical tube. The cavity, open to one side, in the light guide has a coating 84 that is poorly electrically conducting. By means of suitable potentials applied to the contact rings 65, 66, 67, a region is attained with higher electrical field strength, in which a strong secondary electron cascade occurs, arising in the inlet-side region 68 of the interior space 81 of the tube. The ionization density in this region is ideally brought close to the breakdown ionization density. This inlet-side region is adjoined by a region 69 which is longer in comparison with the greatest diameter of a circle which can be inscribed in the cross section, and in which a smaller electrical field strength predominates due to suitable application of potential to the contacts 66, 67, so that in this region a secondary electron multiplication of about 1 occurs, and thus the secondary electron current is kept constant without substantial further amplification. In this elongate second region, a strong gas scintillation occurs because of the large ionization density over a long region, without a supercritical ionization density leading to a breakdown being required. A very sensitive detection of the original secondary electrons is possible by detection of the photons produced in the second region.

The middle contact 66 can also be omitted if instead of the middle contact a field strength in the first region different from the field strength in the second region is set by having the conductivity of the poorly conductive coating in the first region differ from that in the second region. This can be attained, for example, by a different layer thickness in the two regions.

A further advantageous possibility is to permit the production of the secondary electron cascade on the inlet side to take place with a high ionization density, not within the cavity but before the cavity. This can be adjusted with the aid of a further electrode 73 on the end of the detector; the said electrode 73 can likewise be constituted as an electrically poorly conductive coating so that a gradient of the electrical field is set in the direction of the opening of the cavity.

The metallization of the outer surfaces of the light guides 80, 83 is not shown in FIG. 7. A transparent, conductive or poorly conductive coating is also advantageous on the end surface 73.

At this point, it should be mentioned that the cavity does not imperatively need to be circular cylindrical, but on the contrary, cylindrical cavities with plane or differently curved walls are conceivable. A gap can also be used instead of a cavity, with an effective height given by the greatest diameter of a circle that can be inscribed in the gap. However, the contact should then not take place over the whole gap width, but in particular that contact to which the highest potential is applied is to have a sufficient distance from the edges of the gap, so that no flash-over occur. When a gap or interspace is used instead of a cavity, the width of the gap or interspace is to be chosen more than three times as large as the effective height of the gap or interspace, so that such flashovers do not occur.

Figure 8:
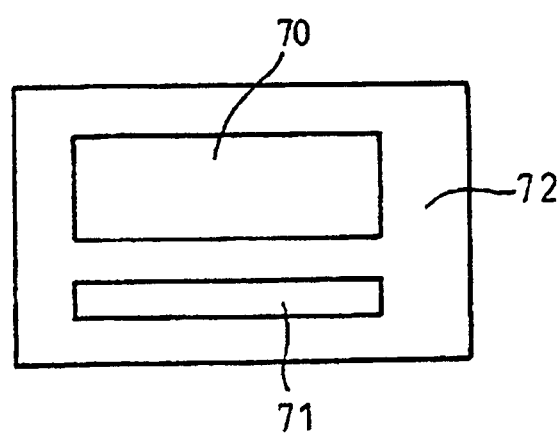
FIG. 8 is a schematic diagram of a further gas scintillation detector with several cavities for different pressure regions.

In a development of the invention, it is also possible to provide several cavities or interspaces with different distances of opposite wall surfaces in at least in one direction. A plan view of such a development is shown in FIG. 8. A preferred embodiment consists in that the cavity 71 with the walls situated at a smaller distance apart reaches closer to the sample than the cavity with the walls situated at a greater distance apart. By means of the different dimensions of the cavities 70, 71 in a light guide 72 perpendicular at least in one direction to the longitudinal axis of the cavity, respectively one of the cavities (70, 71) at the same applied potential is predetermined for a nearly optimum secondary electron cascade at different pressures. According to the respective chamber pressure, one of the cavities can then be chosen as the secondary electron detector, in that the electrode or electrodes in one of the two cavities has the potential applied that forms the secondary electron cascade.

For the cavity with the opposite wall surfaces at the smaller distance, the distance of the contacts can also be chosen smaller than for the cavity with the opposite wall surfaces at a greater distance. In this embodiment, the lower, widely drawn cavity in particular represents a mixed form, in which the increase of the volume with the high ionization density takes place both in and also perpendicularly of the direction of propagation of the secondary electron cascade, since the secondary electron cascade can be propagated over the whole width of the cavity 71.

A further preferred embodiment of the invention consists of using a cavity or interspace whose wall surfaces have a variable spacing, so that the distance between the wall surfaces can be set to the optimum value for the secondary electron cascade at the respective chamber pressure. A sectional diagram of such an embodiment is shown in FIG. 9. A further advantage of this embodiment consists in that the end face of the light guide 83 is provided with a scintillator 87 to which a vaporized layer 88 is applied as a thin contact, which is at 10 kV, for example. Furthermore, a grid 89 is provided in front of this contact in order to attenuate the strong electric field with respect to the sample chamber. This detector can also be used with operation of the scanning electron microscope with high vacuum in the chamber as an Everhardt-Thornley detector. The advantage is particularly that the same light guide 83 with its vacuum connection (not shown in FIG. 9) and the same photodetector 82 can be used both in operation with vacuum in the sample chamber and also in operation with gas in the sample chamber. The same embodiment that is shown in FIG. 9 in a section along the axis of the light guide, is shown in FIG. 10 in a section transverse to the axis of the light guide. It consists of a light guide 83 that is connected to the light guide 80, which borders on the cavity 81 which represents the region, delimited with respect to the sample chamber, in which the increased volume is produced with high ionization density. In contrast to the preceding embodiment, the cavity 81 is opened on both sides. This admittedly requires a greater length than a cavity opened to only one side, but it has the advantage that the mechanical adjustability of the distance of opposite walls of the cavity is facilitated. The adjustability for this is symbolized by two arrows F. The force acts above on the light guide 83 or below on the reinforcement 91.

According to the distance between the opposite walls of the cavity, there is a suitable application of potential to the electrodes 65, 66, 67 corresponding to the embodiment in FIG. 7, in order to produce a strong secondary electron cascade between the electrodes 65, 66 in the first region of the cavity, and to obtain a high ionization density maintained between the electrodes 66 and 67 in the second region of the cavity. The contact 85 is preferably at the potential of the contact 65 or at the potential of the metallization 86. In the region between the contacts 67, 85, a further contribution to the photosignal is also supplied by the fading secondary electron cascade, but is of course markedly smaller than the photosignal produced between the contacts 66 and 67. In this embodiment, it is provided that the cavity is also bounded on the lower side by the light guide 90 metallized from outside, on which a poorly conductive layer 84 is applied just as on the upper light guide 80. Instead of this, it would also be possible to produce the lower boundary 90 of the cavity from an electrically non-conductive reflecting material and to apply the poorly conductive coating 84 directly onto this.

I claim:

1. A scanning electron microscope that operates with gas in a sample chamber, comprising:
    a beam guiding tube for primary electrons,
    a sample chamber,
    a sample holder arranged in the sample chamber,
    a final pressure limiting aperture through which the primary electrons enter the sample chamber,
    a first electrode at a positive potential with respect to the sample holder and the final pressure limiting aperture for acceleration of secondary electrons emergent from a sample received by the sample holder, the first electrode being arranged outside the beam guiding tube, and
    at least one second electrode comprising an end facing toward the sample holder that is at a smaller distance from the sample holder than the first electrode and is at a potential that is between the potential of the first electrode and the potential of the sample, or is at the potential of the sample,
    wherein the second electrode surrounds the first electrode and is substantially in the form of a funnel having a funnel tip toward the sample.

2. The scanning electron microscope according to claim 1, wherein the second electrode runs inclined toward the optical axis of the scanning electron microscope from the first electrode in a direction toward the sample holder, and at its end directed toward the sample holder, forms an opening for penetration of a field produced by the first electrode or by auxiliary electrodes guiding secondary electrons to the first electrode.

3. The scanning electron microscope according to claim 1, wherein an enlarged volume with high but uncritical ionization density is produced by the second electrode.

4. The scanning electron microscope according to claim 1, wherein more than half of the volume with high ionization density is situated in a region that is delimited from the remaining sample chamber by electrodes.

5. The scanning electron microscope according to claim 1, wherein further auxiliary electrodes are provided for guiding secondary electrons to the first electrode.

6. The scanning electron microscope according to claim 1, wherein the first and the second electrode are rotationally symmetric with respect to the optical axis of the scanning electron microscope.

7. The scanning electron microscope according to claim 1, wherein the first electrode annularly surrounds the optical axis of the scanning electron microscope and the second electrode runs conically toward the sample chamber and surrounds the first electrode.

8. The scanning electron microscope according to claim 1, wherein a third electrode surrounds in a tubular form the optical axis of the scanning electron microscope.

9. The scanning electron microscope according to claim 1, wherein the first electrode is arranged at the end of a secondary electron cascade and is at a potential that is positive by more than 100 V with respect to the potential of the final pressure limiting aperture.

10. The scanning electron microscope according to claim 9, wherein the first electrode that is arranged at the end of the secondary electron cascade is at a potential that is positive by at least 550 V with respect to the sample.

11. The scanning electron microscope according to claim 10, wherein the first electrode is at a potential that is positive by more than 600 V with respect to the sample.

12. The scanning electron microscope according to claim 1, wherein the potential of the first electrode is at a potential that is positive by more than 200 V with respect to the potential of the final pressure limiting aperture.

13. The scanning electron microscope according to claim 1, wherein the second electrode is at a potential of at least 100 V with respect to the sample.

14. The scanning electron microscope according to claim 1, wherein the first electrode is fastened to a light-transmitting surface of a light guide and is comprised of several conductive paths or wires, the width of which is less than 1 mm and between which gaps are present through which photons can enter the light guide.

15. The scanning electron microscope according to claim 1, wherein the first electrode is fastened to a light-transmitting surface of a light guide, and a voltage drop takes place along the first electrode, which is either transparent or comprises fine structures, the width of which is less than 1 mm and between which gaps are present through which photons can enter the light guide, wherein the first electrode comprises a material with low conductivity or very thin material thickness, whereby the voltage drop along the first electrode is made possible.

16. A scanning electron microscope that operates with gas in a sample chamber, comprising:
    a sample chamber,
    a sample holder arranged in the sample chamber, said sample holder having a sample potential,
    a final pressure limiting aperture through which the primary electrons enter the sample chamber,
    an electrode arranged outside the beam guiding tube,
    wherein the electrode is electrically poorly conducting and comprises at least two contacts, a first one of said at least two contacts having a first potential and a second one of said at least two contacts having a second potential, and
    wherein an end of the electrode facing toward the sample holder is at an electrical potential that is between a higher one of said first and second potentials and the sample potential, or at the sample potential, and wherein the contact with the higher one of the first and second potentials is at a positive potential with respect to the sample holder and the final pressure limiting aperture.

17. The scanning electron microscope according to claim 16, wherein an enlarged volume with high but uncritical ionization density is produced with the aid of a potential drop along an upper surface of the electrically poorly conducting electrode.

18. The scanning electron microscope according to claim 16, wherein more than half of the volume with high ionization density is situated in a region that is delimited from the remaining sample chamber by electrodes.

19. The scanning electron microscope according to claim 16, wherein further auxiliary electrodes are provided for guiding secondary electrons to the first electrode.

20. The scanning electron microscope according to claim 16, wherein the electrically poorly conducting electrode is rotationally symmetric with respect to the optical axis of the scanning electron microscope.

21. The scanning electron microscope according to claim 16, wherein a further electrode annularly surrounds the optical axis of the scanning electron microscope and said electrically poorly conducting electrode runs conically toward the sample chamber and surrounds the further electrode.

22. The scanning electron microscope according to claim 16, wherein a further electrode surrounds in a tubular form the optical axis of the scanning electron microscope.

23. The scanning electron microscope according to claim 16, wherein the electrically poorly conducting electrode is located in the interior of a cavity that is open to one side in a light guide.

24. The scanning electron microscope according to claim 23, wherein the electrically poorly conducting electrode extends over an extended section in the cavity in the light guide.

25. The scanning electron microscope according to claim 23, wherein the cavity in the light guide is of pyramidal shape.

26. A detector for secondary electrons in a scanning electron microscope with high pressure in a sample chamber with the use of a secondary electron cascade, wherein at least one electrode with low electrical conductivity is provided, which extends along an elongate interspace or elongate cavity, and wherein in an inlet-side region within or in front of the cavity or interspace, the at least one electrode can have a potential applied such that a high amplification for secondary electrons results, and an elongate volume region with a reduced amplification factor for secondary electrons adjoins this inlet-side region.

27. The detector according to claim 26, wherein the cavity is formed in a light guide or borders on a light guide, and the light guide is constituted for detection of gas scintillation.

28. The detector according to claim 26, wherein the at least one electrode is transparent or comprises fine structures with interspaces for passage of light.

29. The detector according to claim 26, wherein the potential of the at least one electrode in the cavity or interspace is in places at least 200 V positive with respect to a final pressure limiting aperture of the scanning electron microscope.

30. The detector according to claim 26, wherein the potential of the at least one electrode in the cavity or interspace is in places at least 400 V positive with respect to a final pressure limiting aperture of the scanning electron microscope.

31. The detector according to claim 26, wherein the potential of the at least one electrode in the cavity or interspace is in places greater than 600 V positive with respect to the sample emitting secondary electrons.

32. The detector according to claim 26, wherein the elongate volume region is greater in a longitudinal direction than twice the greatest diameter of a circle that can be inscribed in the cross section of the cavity or interspace.

33. The detector according to claim 26, wherein the reduced amplification factor is smaller than 5.

34. The detector according to claim 26, wherein the reduced amplification factor is smaller than 2.

35. The detector according to claim 26, wherein the reduced amplification factor is greater than 0.2.

36. The detector according to claim 26, wherein the reduced amplification factor is greater than 0.2.

37. A detector for secondary electrons in a scanning electron microscope with high pressure in a sample chamber with the use of a secondary electron cascade, wherein a plurality of electrodes are provided that extend along an elongate interspace or elongate cavity wherein in an inlet-side region within or in front of the cavity or interspace, the electrodes can have a potential applied such that a high amplification for secondary electrons results, and an elongate volume region with a reduced amplification factor for secondary electrons adjoins this inlet-side region, and wherein the application of potential to the electrodes in the elongate volume region takes place such that an adjacent electrical field counteracts a tenuation of the secondary electron cascade due to impacts in the gas and due to drifting of the secondary electrons to the walls, so that a high but uncritical ionization density remains sustained.

38. The detector according to claim 37, wherein the cavity is formed in a light guide or borders on a light guide, and the light guide is constituted for detection of gas scintillation.

39. The detector according to claim 37, wherein the at least one electrode is transparent or comprises fine structures with interspaces for passage of light.

40. The detector according to claim 37, wherein the potential of the at least one electrode in the cavity or interspace is in places at least 200 V positive with respect to a final pressure limiting aperture of the scanning electron microscope.

41. The detector according to claim 37, wherein the potential of the at least one electrode in the cavity or interspace is in places at least 400 V positive with respect to a final pressure limiting aperture of the scanning electron microscope.

42. The detector according to claim 37, wherein the potential of the at least one electrode in the cavity or interspace is in places greater than 600 V positive with respect to the sample emitting secondary electrons.

43. The detector according to claim 37, wherein the elongate volume region is greater in a longitudinal direction than twice the greatest diameter of a circle that can be inscribed in the cross section of the cavity or interspace.

44. The detector according to claim 37, wherein the reduced amplification factor is smaller than 5.

45. The detector according to claim 37, wherein the reduced amplification factor is smaller than 2.

* * * * *